United States Patent
Samson et al.

(10) Patent No.: US 10,394,471 B2
(45) Date of Patent: Aug. 27, 2019

(54) ADAPTIVE POWER REGULATION METHODS AND SYSTEMS

(71) Applicant: QUALCOMM Incorporated, San Diego, CA (US)

(72) Inventors: Giby Samson, San Diego, CA (US); Keith Alan Bowman, Morrisville, NC (US); Yu Pu, San Diego, CA (US); Francois Ibrahim Atallah, Raleigh, NC (US)

(73) Assignee: QUALCOMM Incorporated, San Diego, CA (US)

( * ) Notice: Subject to any disclaimer, the term of this patent is extended or adjusted under 35 U.S.C. 154(b) by 227 days.

(21) Appl. No.: 15/245,725

(22) Filed: Aug. 24, 2016

(65) Prior Publication Data
US 2018/0059975 A1    Mar. 1, 2018

(51) Int. Cl.
*G06F 1/324* (2019.01)
*G06F 3/06* (2006.01)
(Continued)

(52) U.S. Cl.
CPC ............ *G06F 3/0625* (2013.01); *G06F 1/324* (2013.01); *G06F 1/3262* (2013.01); *G06F 1/3275* (2013.01); *G06F 3/0629* (2013.01); *G06F 3/0673* (2013.01); *G11C 5/14* (2013.01); *G11C 5/147* (2013.01); *G11C 29/021* (2013.01);
(Continued)

(58) Field of Classification Search
CPC ....... G01R 31/2621; G05F 3/245; G06F 1/26; G06F 1/324; G06F 1/3262; G06F 3/0625; G06F 3/0629; G06F 3/0673; G11C 11/413; G11C 11/412; G11C 11/417;
(Continued)

(56) References Cited

U.S. PATENT DOCUMENTS

| | | | |
|---|---|---|---|
| 6,882,172 B1 | 4/2005 | Suzuki et al. | |
| 8,146,036 B1 * | 3/2012 | Ren .......................... | H01L 22/34 716/110 |

(Continued)

FOREIGN PATENT DOCUMENTS

| CN | 103915358 A | 7/2014 |
|---|---|---|
| WO | 2015196772 A1 | 12/2015 |

OTHER PUBLICATIONS

Qin, Hulfang, et al. "SRAM leakage suppression by minimizing standby supply voltage." Quality Electronic Design, 2004. Proceedings. 5th International Symposium on. IEEE, 2004. (Year: 2004).*
(Continued)

*Primary Examiner* — Jaweed A Abbaszadeh
*Assistant Examiner* — Brian J Corcoran
(74) *Attorney, Agent, or Firm* — W&T/Qualcomm

(57) ABSTRACT

Adaptive power regulation methods and systems are disclosed. In one aspect, one or more process sensors for memory elements are provided, which report information relating to inherent speed characteristics of sub-elements within the memory elements. Based on this reported information, a controller ascertains an appropriate power level to insure a proper data retention voltage (DRV) is applied on voltage rails by a power management unit (PMU) circuit. By using the proper DRV based on the speed characteristics of the sub-elements within the memory elements, power conservation is achieved.

27 Claims, 9 Drawing Sheets

(51) Int. Cl.
*G06F 1/3234* (2019.01)
*G11C 5/14* (2006.01)
*G11C 29/02* (2006.01)
*G11C 29/04* (2006.01)

(52) U.S. Cl.
CPC .... *G11C 29/028* (2013.01); *G11C 2029/0409* (2013.01); *Y02D 10/14* (2018.01)

(58) Field of Classification Search
CPC .......... G11C 11/419; G11C 2029/5002; G11C 29/50; H01L 22/34
See application file for complete search history.

(56) References Cited

U.S. PATENT DOCUMENTS

| | | | | |
|---|---|---|---|---|
| 8,355,277 | B2* | 1/2013 | Cheng | G11C 11/413 365/154 |
| 8,355,293 | B2 | 1/2013 | Van Winkelhoff et al. | |
| 8,970,275 | B1* | 3/2015 | Ren | H03H 11/265 327/261 |
| 9,112,484 | B1 | 8/2015 | Clark et al. | |
| 9,123,436 | B2 | 9/2015 | Chiou et al. | |
| 9,142,322 | B2 | 9/2015 | Baranwal et al. | |
| 9,299,419 | B1 | 3/2016 | Singh et al. | |
| 9,324,451 | B2* | 4/2016 | Gupta | G11C 29/04 |
| 2006/0012391 | A1 | 1/2006 | Huang | |
| 2008/0165608 | A1* | 7/2008 | Choi | G11C 5/145 365/228 |
| 2009/0213641 | A1* | 8/2009 | Park | G11C 11/412 365/154 |
| 2009/0251171 | A1* | 10/2009 | Butts | H03K 19/0016 326/33 |
| 2010/0026335 | A1* | 2/2010 | Fujii | G01R 31/2621 324/762.09 |
| 2010/0039154 | A1 | 2/2010 | Yamashita | |
| 2010/0254209 | A1 | 10/2010 | Lee et al. | |
| 2011/0043243 | A1 | 2/2011 | Bhushan et al. | |
| 2011/0298550 | A1* | 12/2011 | Sandhu | H03K 3/0315 331/108 R |
| 2012/0051395 | A1* | 3/2012 | Chen | G01K 7/01 374/142 |
| 2013/0134984 | A1 | 5/2013 | Terada et al. | |
| 2013/0163357 | A1* | 6/2013 | Buer | G11C 8/08 365/201 |
| 2013/0300386 | A1* | 11/2013 | Priel | G11C 5/147 323/274 |
| 2014/0306735 | A1 | 10/2014 | Rasouli et al. | |
| 2017/0219649 | A1 | 8/2017 | Shan et al. | |

OTHER PUBLICATIONS

Hua, Chung-Hsien, Tung-Shuan Cheng, and Wei Hwang. "Distributed data-retention power gating techniques for column and row co-controlled embedded SRAM." Memory Technology, Design, and Testing, 2005. MTDT 2005. 2005 IEEE International Workshop on. IEEE, 2005. (Year: 2005).*

S. Mukhopadhyay, K. Kim, H. Mahmoodi and K. Roy, "Design of a Process Variation Tolerant Self-Repairing SRAM for Yield Enhancement in Nanoscaled CMOS," in IEEE Journal of Solid-State Circuits, vol. 42, No. 6, pp. 1370-1382, Jun. 2007. (Year: 2007 ).*

Mukherjee; Debasis et al., "Static Noise Margin Analysis of SRAM Cell for High Speed Application," IJCSI International Journal of Computer Science Issues, vol. 7, No. 5, Sep. 2010, pp. 175-180.

Wu, Chen et al., "Leakage Reduction of Sub-55nm SRAM Based on a Feedback Monitor Scheme for Standby Voltage Scaling," International SOC Design Conference (ISOCC), Nov. 22, 2010, IEEE, Piscataway, NJ, USA, pp. 315-318.

Invitation to Pay Additional Fees and Partial International Search Report for PCT/US2017/039388, dated Jan. 4, 2018, 29 pages.

International Search Report and Written Opinion for PCT/US2017/039388, dated Apr. 17, 2018, 31 pages.

Invitation to Restrict or Pay Additional Fees for PCT/US2017/039388, dated Aug. 13, 2018, 3 pages.

Second Written Opinion for PCT/US2017/039388, dated Sep. 20, 2018, 18 pages.

International Preliminary Report on Patentability for PCT/US2017/039388, dated Nov. 21, 2018, 31 pages.

* cited by examiner

ADAPTIVE POWER REGULATION METHODS AND SYSTEMS

BACKGROUND

I. Field of the Disclosure

The technology of the disclosure relates generally to power conservation in memory elements.

II. Background

Computing devices have become common in modern society. Almost every computing device relies on some form of dynamic memory which allows data to be stored therein for subsequent use. Most such memory elements are made from semiconductor materials and particularly are made from cross-coupled inverters within the semiconductor material.

One metric of the ability of a memory element to retain its state is the hold static noise margin (SNM). Likewise, the data retention voltage (DRV) is the voltage which causes the SNM to be zero. While all such cross-coupled devices have some DRV, which in turn generates a leakage current and consumes power, mobile computing devices, such as smart phones and tablets, use batteries and are under pressure from consumers to reduce power consumption.

Further adding to the complexity of managing power consumption in mobile computing devices, most semiconductor materials may experience process variations during the manufacturing processes. Such process variations may result in a semiconductor material that is typical (T), fast (F), or slow (S). Such variations may be different for different types of elements within a single semiconductor material. For example, an N-type Metal Oxide Semiconductor (MOS) (NMOS) field effect transistor (FET) within an inverter might be fast while a P-type MOS (PMOS) FET within the same inverter might be slow. Having different speeds affects the DRV of the device. Thus, a single memory array may have cross-coupled inverters of a variety of different speeds. Designers typically assume a worst case and increase the DRV for the voltage rails to help insure that all the elements retain the appropriate values stored therein. Such increased DRV may result in increased leakage for other elements in the memory array. Such increased leakage current increases power consumption and shortens the days of use (DoU) metric. Accordingly, designers would appreciate ways to avoid having to use the over-engineered DRV, and thus, decrease power consumption for memory elements.

SUMMARY OF THE DISCLOSURE

Aspects disclosed in the detailed description include adaptive power regulation methods and systems. Exemplary aspects of the present disclosure provide one or more process sensors for memory elements, which report information relating to inherent speed characteristics of sub-elements within the memory elements. Based on this reported information, a controller ascertains an appropriate power level to insure a proper data retention voltage (DRV) is applied on voltage rails by a power management unit (PMU) circuit. By using the proper DRV based on the speed characteristics of the sub-elements within the memory elements, power conservation is achieved.

In this regard in one aspect, a control circuit for controlling a DRV for a memory element is disclosed. The control circuit includes a mapping logic element. The mapping logic element is configured to receive a signal with information relating to a speed characteristic of sub-elements of a memory element. The mapping logic element is also configured to map the information to a process variation identifier. The control circuit also includes a DRV mapping logic element. The DRV mapping logic element is configured to map the process variation identifier to a desired DRV and output information relating to the desired DRV. The control circuit also includes a power control element configured to receive the information relating to the desired DRV and generate a power control signal for a PMU.

In another aspect, a system for controlling power for a memory element is disclosed. The system includes a sensor module. The sensor module is configured to determine information related to a process speed characteristic of an associated memory element. The system also includes a control system. The control system is configured to receive an indication of the process speed characteristic from the sensor module and output a power control signal based at least in part on the process speed characteristic. The system also includes a PMU. The PMU is configured to receive the power control signal from the control system and control voltage rails for the associated memory element.

In another aspect, a method for controlling power provided to a memory element is disclosed. The method includes receiving information relating to a speed characteristic of sub-elements within a memory element. The method also includes mapping the information relating to the speed characteristic to a process variation corner. The method also includes determining a desired DRV. The method also includes generating a power control signal based on the desired DRV.

In another aspect, an adaptive DRV circuit is disclosed. The adaptive DRV circuit includes a sensor circuit. The sensor circuit is configured to determine a first current corresponding to P-type metal oxide semiconductor (MOS) (PMOS) transistors indicative of a process variation. The sensor circuit is also configured to determine a second current corresponding to N-type MOS (NMOS) transistors indicative of the process variation. The sensor circuit is also configured to generate a PMOS frequency based on the first current. The sensor circuit is also configured to generate an NMOS frequency based on the second current. The adaptive DRV also includes a controller circuit. The controller circuit is configured to generate a PMOS magnitude of variation identifier based on the PMOS frequency. The controller circuit is also configured to generate an NMOS magnitude of variation identifier based on the NMOS frequency. The controller circuit is also configured to generate a process corner identifier based on the PMOS magnitude of variation identifier and the NMOS magnitude of variation identifier. The controller circuit is also configured to generate an adaptive DRV based on the process corner identifier. The controller circuit is also configured to generate DRV control signals based on the adaptive DRV, wherein the DRV control signals cause a power supply to provide the adaptive DRV to a logic circuit in response to the logic circuit indicating a retention mode.

DETAILED DESCRIPTION

Figure 1A:
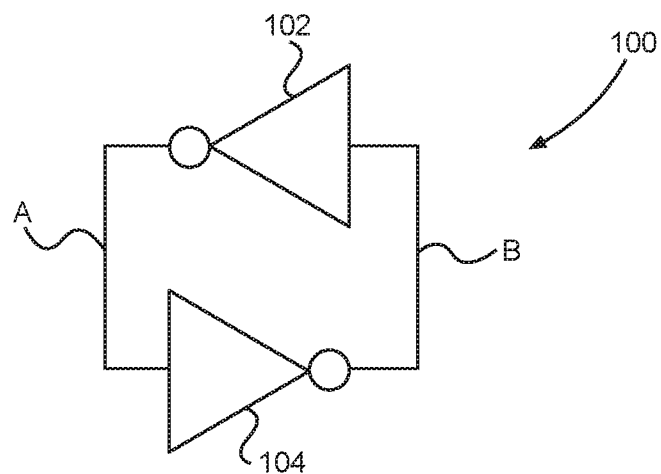
FIG. 1A is a block diagram of an exemplary cross-coupled inverter memory element.

With reference now to the drawing figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

Aspects disclosed in the detailed description include adaptive power regulation methods and systems. Exemplary aspects of the present disclosure provide one or more process sensors for memory elements, which report information relating to inherent speed characteristics of sub-elements within the memory elements. Based on this reported information, a controller ascertains an appropriate power level to insure a proper data retention voltage (DRV) is applied on voltage rails by a power management unit (PMU) circuit. By using the proper DRV based on the speed characteristics of the sub-elements within the memory elements, power conservation is achieved.

Figure 1B:
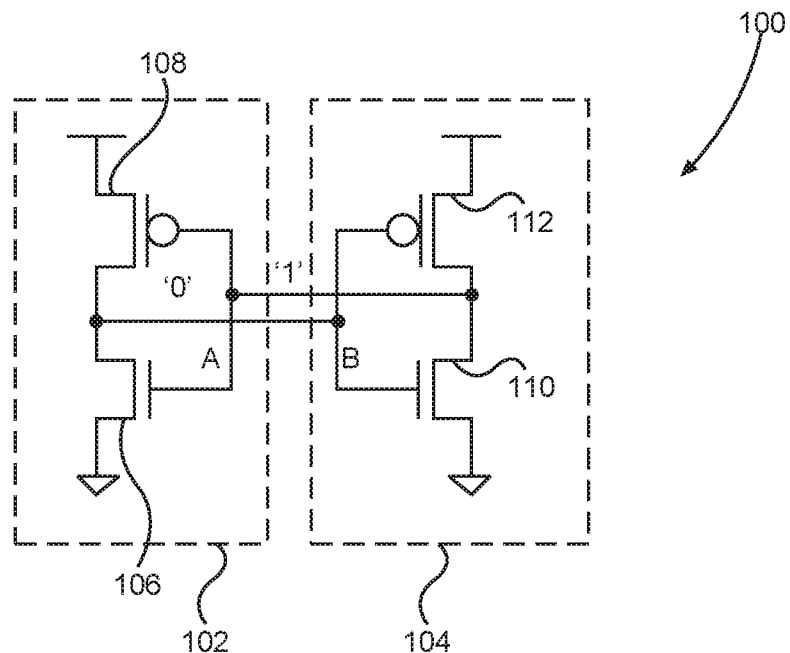
FIG. 1B is a circuit diagram of the cross-coupled inverter memory element of FIG. 1A.

It should be appreciated that many sorts of memory elements may benefit from the power adaptive power regulation systems and methods of the present disclosure, including flip-flops, latches, static random access memory (SRAM), register files, or the like. However, in most such memory elements, the state of the memory element is held by a pair of cross-coupled inverters. In this regard, FIG. 1A is a block diagram of an exemplary cross-coupled inverter memory element 100 (hereinafter, just memory element 100) having a first inverter 102 and a second inverter 104. The first inverter 102 and the second inverter 104 share an A node and a B node as illustrated. FIG. 1B is a circuit diagram of the memory element 100. The first inverter 102 includes a first N-type metal oxide semiconductor (MOS) (NMOS) field effect transistor (FET) 106 and a first P-type MOS (PMOS) FET 108. Similarly, the second inverter 104 includes a second NMOS FET 110 and a second PMOS FET 112.

When a semiconductor wafer including the first inverter 102 and the second inverter 104 is made, there may be process variations which cause the sub-elements (i.e., the NMOS FETs 106 and 110 and the PMOS FETs 108 and 112) to have different speed characteristics as is well understood. Specifically, the sub-elements may be fast (F), slow (S), or typical (T). It should further be appreciated that the process variations may mean that the sub-elements do not have the same speed characteristics, and thus, the sub-elements could be TT, FF, SS, TF, FT, TS, ST, SF, or FS. With non-typical speed characteristics, a higher DRV may be required to make sure that the memory element 100 retains its state. Typically, designers will over engineer the voltage level to make sure that a high DRV is supplied just in case any of the mixed speed combinations appear in a memory element. Such heightened voltage levels leads to increased leakage current and, in general, contributes to increased power consumption.

Figure 2:
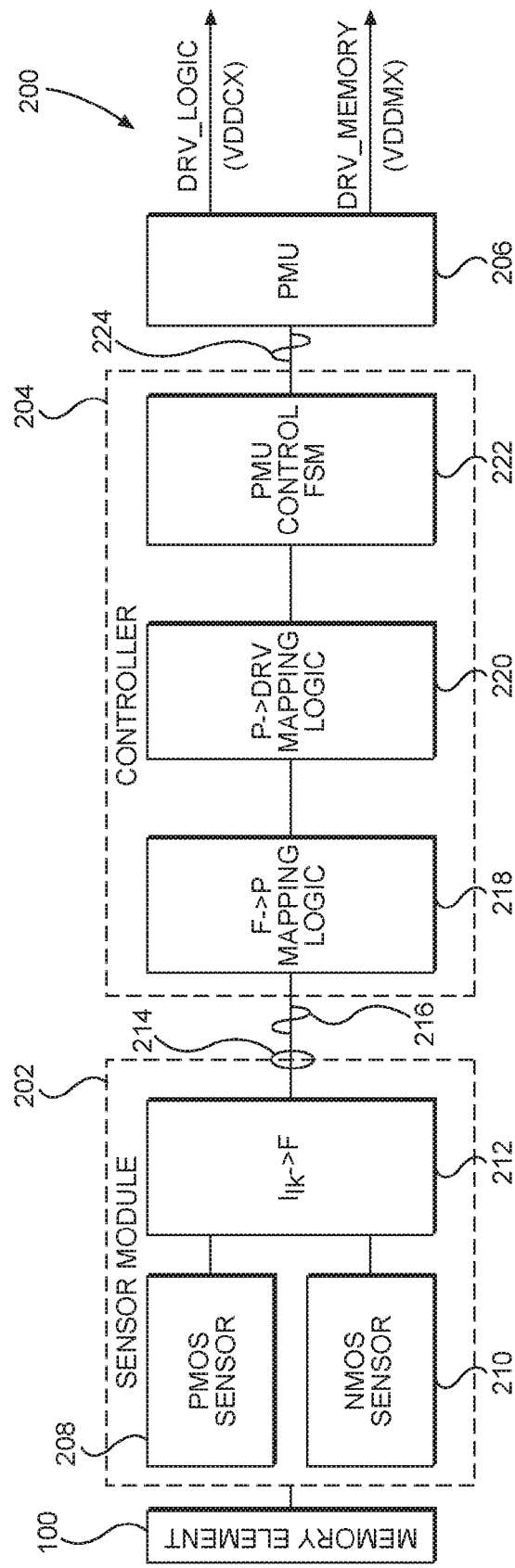
FIG. 2 is a simplified block diagram of an exemplary system for sensing speed characteristics and generating power control signals based thereon for memory elements.

Exemplary aspects of the present disclosure allow for adaptive power regulation for memory elements such that an appropriate power level is selected based at least in part on the speed characteristics of the sub-elements. By selecting an appropriate power level, leakage current is minimized and power consumption reduced, which in turn improves the days of use (DoU) metric that is sometimes used. In this regard, FIG. 2 is a simplified block diagram of an exemplary system 200 for sensing speed characteristics and generating power control signals based thereon for memory element 100 of FIGS. 1A and 1B. In particular, the system 200 includes a sensor module 202, a controller 204, and a PMU 206. The sensor module 202 includes a PMOS sensor 208 and an NMOS sensor 210. In an exemplary aspect, the PMOS sensor 208 and the NMOS sensor 210 detect leakage current, and the sensor module 202 includes a current-to-frequency counter 212. The leakage current is indicative of a process variation. Thus, in effect, the sensors 208 and 210 determine currents indicative of process variations in corresponding PMOS and NMOS sub-elements. An output 214 of the sensor module 202 provides a frequency signal 216 to the controller 204. The frequency signal 216 effectively carries information about the speed characteristics of the sub-elements of the memory element 100. Various types of sensor modules are explored below with reference to FIGS. 5-6B. However, it should appreciated that other types of sensors may be used so long as they are capable of conveying information about the speed characteristics of the sub-elements of the memory element 100.

Continuing the example, where the sensor module 202 outputs the frequency signal 216, the controller 204 includes a frequency-to-process (F→P) mapping logic element 218 which takes the frequency signal 216 and uses a look-up table or the like to determine to what process corner the sub-elements of the memory element 100 belong (e.g., TT, FF, SS, FS, SF, TF, FT, ST, TS). A signal containing information relating to the process corner is output. In an exemplary aspect, the information relating to the process corner is a process corner identifier. While only a gross speed characteristic is explicitly recited herein, it should be appreciated that the sensor module 202 may provide increased granularity by indicating how "fast" or how "slow" the sub-element is. Such increased granularity provides a better DRV value as explained below, but at the expense of a more complicated sensor and a larger look-up table.

With continued reference to FIG. 2, the controller 204 further includes a process-to-DRV (P→DRV) mapping logic element 220, which uses a look-up table or the like to determine what is an appropriate DRV using the information related to the process corner in which the sub-elements of the memory element 100 can be found. Information related to the appropriate or desired DRV is provided to PMU control finite state machine (FSM) 222. In an exemplary aspect, the information related to the appropriate or desired DRV is an actual desired DRV value. The PMU control FSM 222 provides a control signal 224 to the PMU 206. The PMU 206 outputs two control signals, DRV_Logic and DRV_Memory, which control voltage rails (not illustrated) coupled to the memory element 100.

Figure 3:
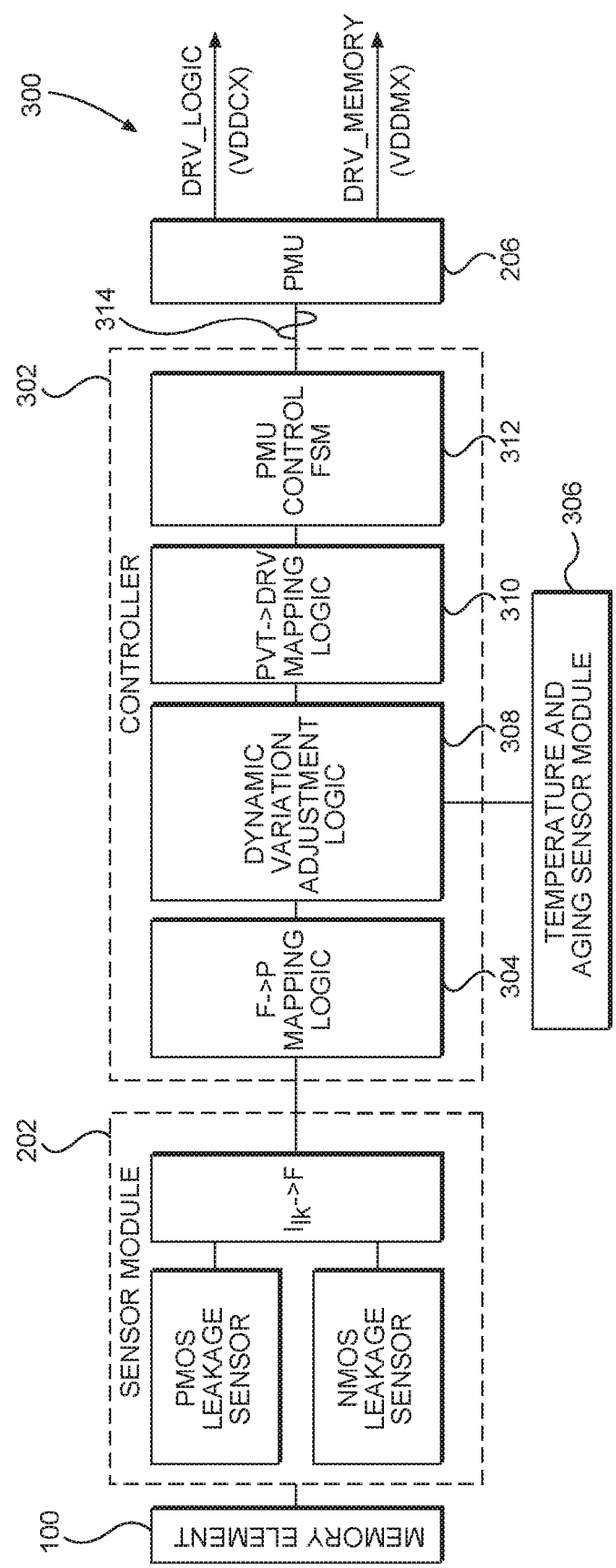
FIG. 3 is a simplified block diagram of an exemplary system for sensing speed characteristics as well as temperature and aging characteristics for generating power control signals based thereon for memory elements.

FIG. 3 is a simplified block diagram of an exemplary system 300 for sensing speed characteristics as well as temperature and aging characteristics for generating power control signals based thereon for memory element 100. Temperature and aging may also change the appropriate DRV, and a more complete solution would adapt the DRV based on these parameters as well. In this regard, the sensor module 202 of FIG. 2 operates as previously discussed. In place of the controller 204, a controller 302 is used, which includes a frequency-to-process mapping logic element 304 similar to the frequency-to-process mapping logic element 218. However, instead of just relying on the sensor module 202, the system 300 includes temperature and aging sensor module 306. The temperature and aging sensor module 306 may include separate and multiple temperature sensors (not separately illustrated) as well as aging information in a database (not shown). Such temperature sensors and aging information are well understood. The controller 302 takes the output of the frequency-to-process mapping logic element 304 and the output from the temperature and aging sensor module 306 and uses a dynamic variation adjustment logic element 308 to determine a process-variation-temperature (PVT) corner. This determination may be done through a look-up table or the like. The dynamic variation adjustment logic element 308 outputs the PVT corner to a PVT-DRV mapping logic element 310, which determines the appropriate DRV based on a look-up table or the like. The PVT-DRV mapping logic element 310 outputs the desired DRV value to a PMU control FSM 312, which in turn provides a control signal 314 to the PMU 206.

Figure 4:
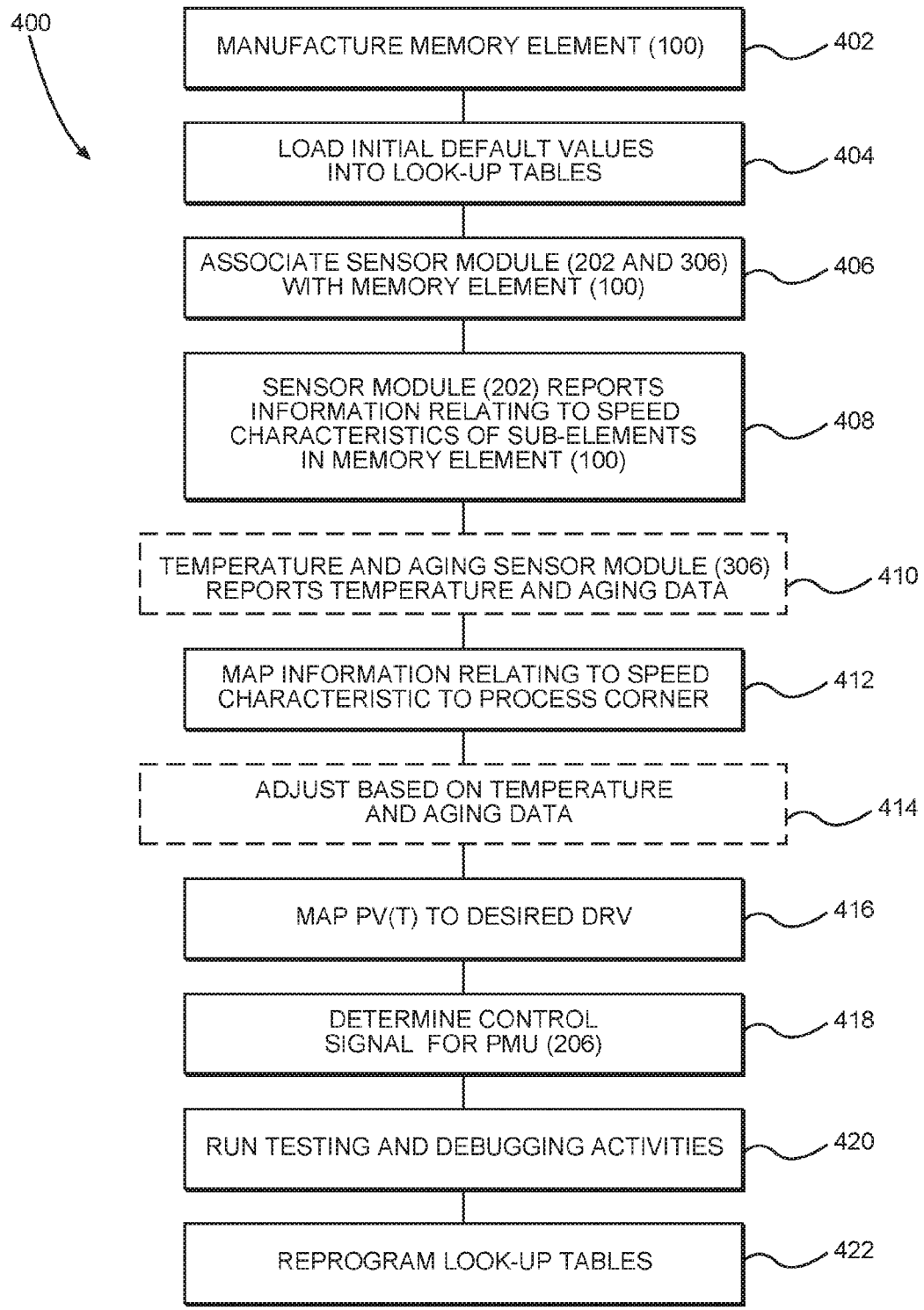
FIG. 4 is a flowchart of an exemplary method for determining speed characteristics and generating an appropriate power control signal for memory elements such as may be performed by the systems of FIGS. 2 and 3.

Against the explanation of the hardware elements of the systems 200 and 300 of FIGS. 2 and 3, FIG. 4 is a flowchart of an exemplary method 400 for determining speed characteristics and generating an appropriate power control signal for memory elements such as may be performed by the systems 200 or 300. The method 400 begins with the manufacture of the cross-coupled inverter memory element 100 (block 402). The designers may load initial default values into the various look-up tables (e.g., the look-up tables in the mapping logic element 220 or 310) (block 404). The assembly continues with the association of the sensor module 202 (and optionally the temperature and aging sensor module 306) with memory element 100 (block 406). There is a tradeoff for how many sensor modules 202 are used. The more sensor modules 202 that are used, the better the resolution for determining the appropriate DRV, but the more sensor modules 202, the greater the cost and area penalty as well as the more routing decisions that must be made. While it is anticipated that the sensor modules 202 may be positioned exteriorly relative to memory element 100, it is possible that the sensor modules 202 may be within a memory package or even within the memory element 100.

With continued reference to FIG. 4, when assembly is complete, the sensor module 202 reports information relating to speed characteristics of sub-elements in the memory element 100 (block 408). If the temperature and aging sensor module 306 is present, it reports temperature and aging data (block 410). The controller 204 or 302 (and particularly the mapping logic element 218 or 304) maps information relating to the speed characteristic to a process corner (block 412). If the temperature and aging sensor module 306 is present, the controller 204 or 302 may further adjust the process corner based on the temperature and aging data (block 414). The controller 204 or 302 takes the (adjusted) process corner information and maps the process variation (−temperature) (PV(T)) to a desired DRV (block 416) using the look-up table or the like. Based on the desired DRV, the controller 204 or 302 determines a control signal for the PMU 206 (block 418).

Before manufacture is complete, the manufacturer may run testing and debugging activities for the system 200 (or 300) (block 420). During such testing and debugging, it may be determined that the initial default values for the look-up tables are not optimal. Accordingly, the look-up tables may be reprogrammed (block 422) as part of the testing and debugging activities.

Figure 5:
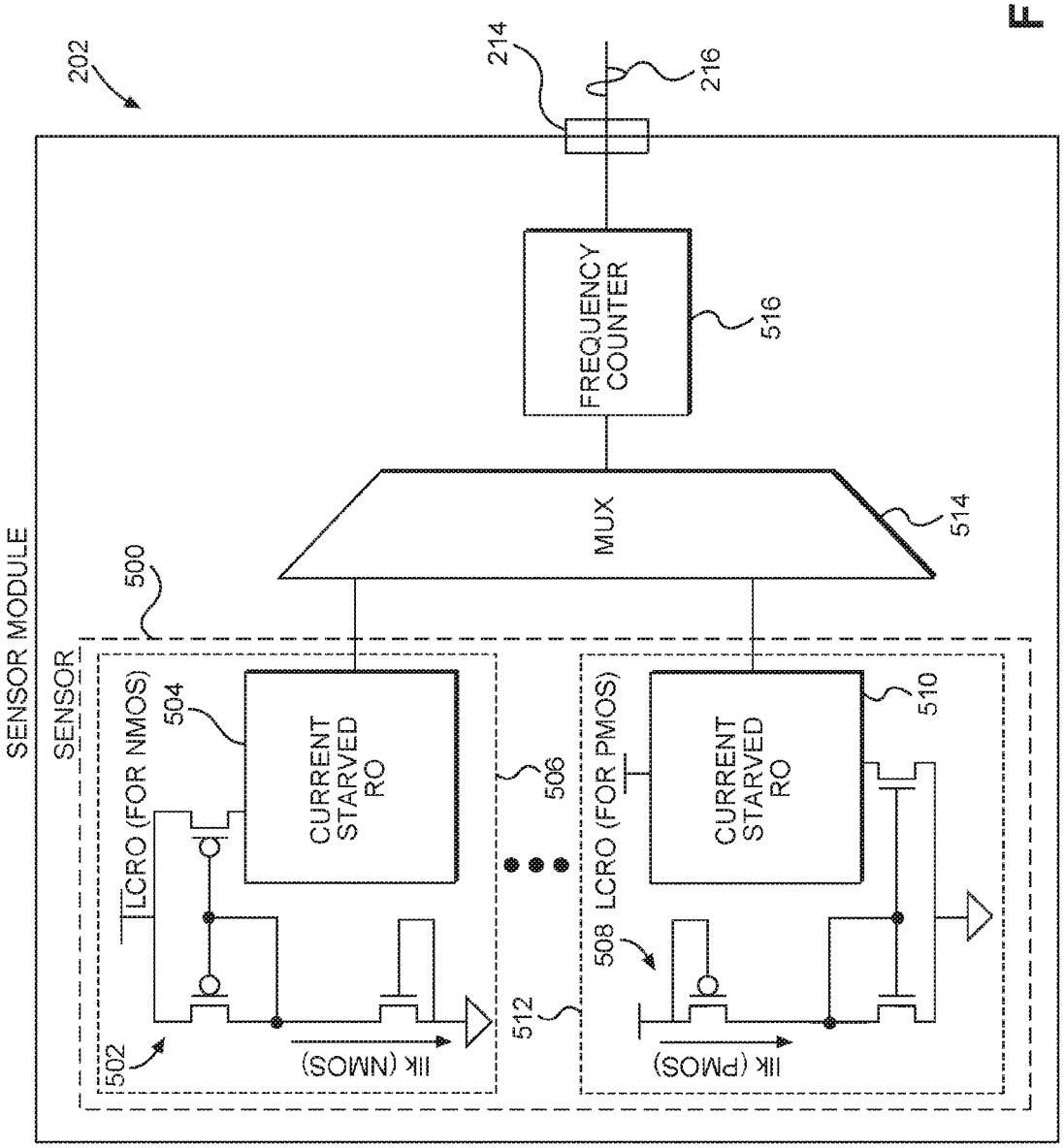
FIG. 5 is a block diagram of a simplified sensor that may be used to detect information about speed characteristics for memory elements.

FIG. 5 is a block diagram of a simplified sensor module 202 that may be used to detect information about speed characteristics for memory element 100. In particular, the sensor module 202 may include a sensor 500 that includes a first leakage sensor 502 combined with a first current starved ring oscillator 504, collectively first leakage current ring oscillator (LCRO) 506, to provide a current-to-frequency conversion for NMOS sub-elements within the memory element 100. The sensor 500 may further include a second leakage sensor 508 combined with a second current starved ring oscillator 510, collectively second LCRO 512, to provide a current-to-frequency conversion for PMOS sub-elements within the memory element 100. The outputs of the first and second LCRO 506 and 512 are multiplexed by a multiplexer 514 and provided to a frequency counter 516, which outputs, in an exemplary aspect, the frequency signal 216 described above. In an exemplary aspect, where the sensor module 202 conforms to the structure set out in FIG. 5, such sensor modules may be scattered across an entire die with a density of approximately one every 0.5 mm to one every 1 mm apart. Such sensor modules may each be communicatively connected directly to the controller 204 of FIG. 2. Alternatively, the sensor modules may be arranged in a daisy chain configuration with a first and last element connected to the controller 204 and all the sensor modules in between connected to another sensor module of similar kind to complete a chain (e.g., PMOS elements to PMOS elements). In still another exemplary aspect, where the memory element 100 is built using specific devices optimized by the foundry (e.g., to optimize performance, reliability, and yield), the current mirror structure (i.e., the leakage sensors 502 and 508) could reside in modified bit cells. Modified bit cell columns can then be placed as required within the array to capture an average cell behavior.

Figure 6A:
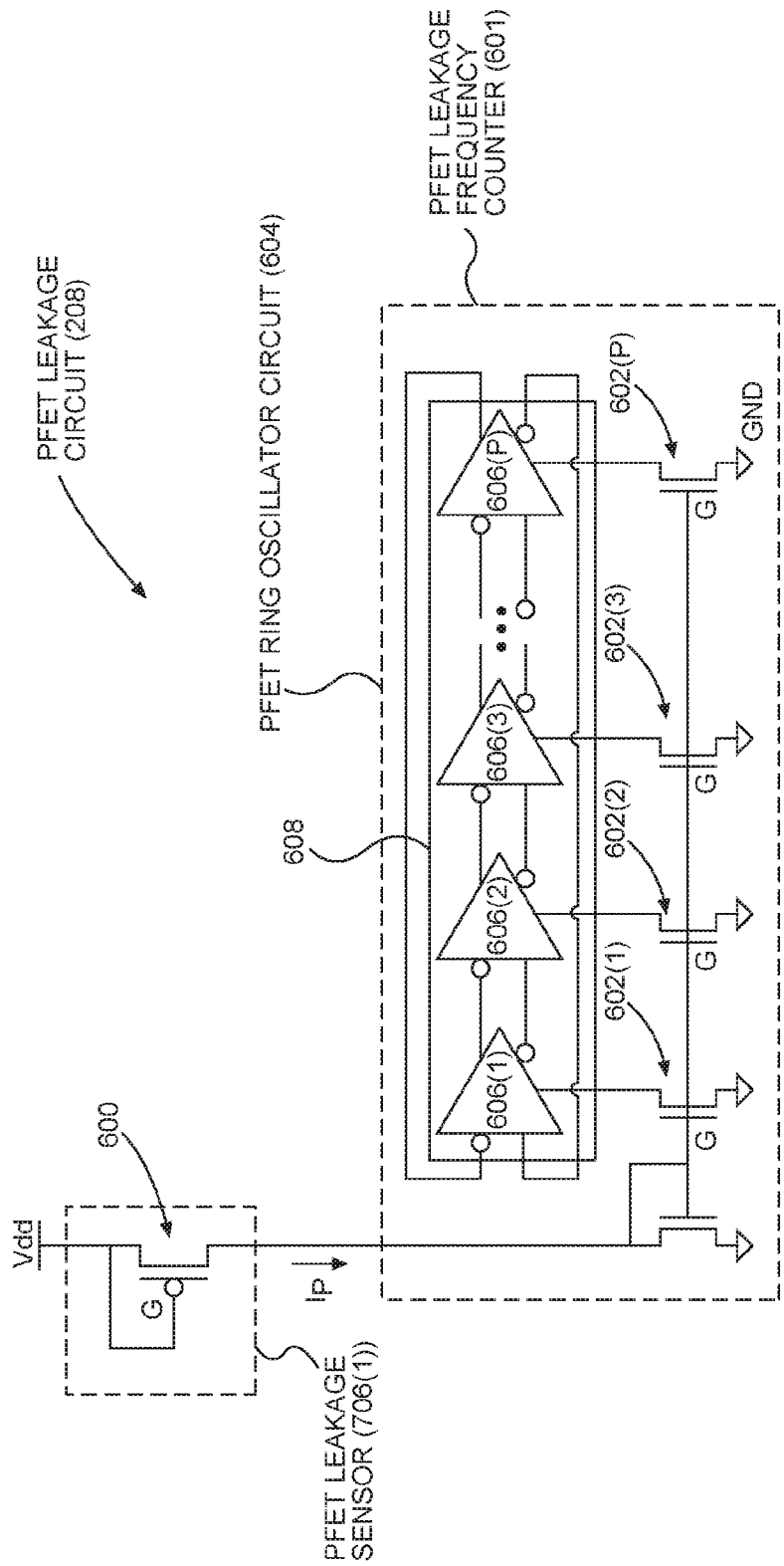
FIGS. 6A and 6B are more detailed block diagrams of the sensor of FIG. 5 that may be used to detect information about speed characteristics for memory elements.
Figure 6B:
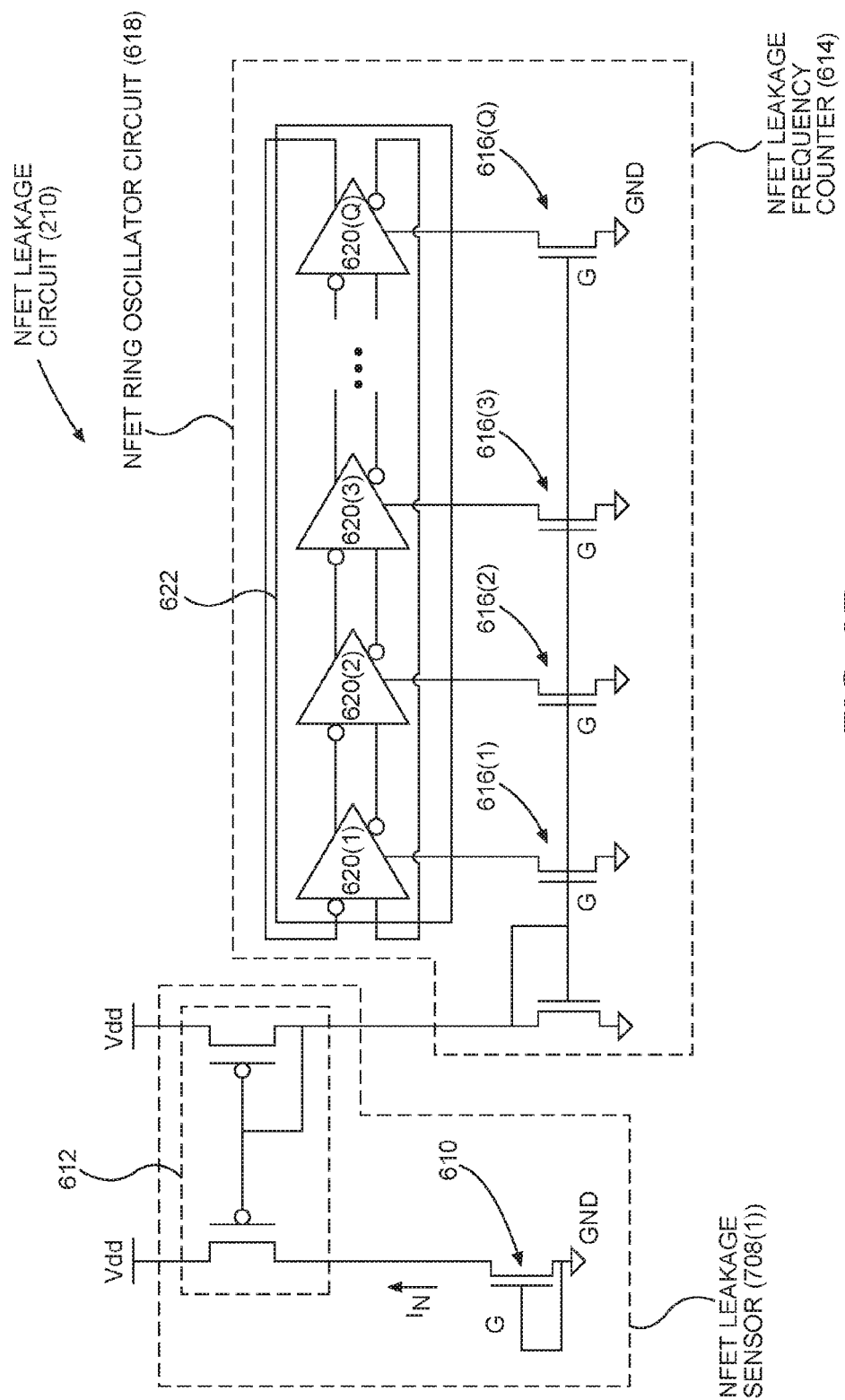

FIGS. 6A and 6B are more detailed block diagrams of the sensor 500 of FIG. 5 that may be used to detect information about speed characteristics for memory element 100. In particular, a PMOS sensor 208 is provided that is comprised of a PMOS FET (PFET) 600. A gate (G) of the PFET 600 is tied to voltage Vdd so that the PFET 600 is turned off or deactivated. Thus, any PFET leakage current $I_P$ is provided to a PFET leakage frequency counter 601 as leakage current from the PFET 600. The PFET leakage current $I_P$ is coupled to a series of gates (G) of NFETs 602(1)-602(P) in a PFET ring oscillator circuit 604 in the PMOS sensor 208. The NFETs 602(1)-602(P) are each configured to control activation of a respective buffer circuit 606(1)-606(P) configured in an oscillation loop 608 in the PFET ring oscillator circuit 604. Thus, the strength of the PFET leakage current $I_P$ controls the turn-on strength of the NFETs 602(1)-602(P) in the PFET ring oscillator circuit 604, which in turn controls the speed or oscillation of the buffer circuits 606(1)-606(P) to provide an indication of the PFET leakage current. For example, each iteration of the oscillation loop 608 could be used to increment a PFET leakage frequency count.

Similarly, an example of the NMOS sensor 210 is comprised of an NMOS FET (NFET) 610 and a PFET current mirror 612. A gate (G) of the NFET 610 is tied to ground (GND) so that the NFET 610 is turned off or deactivated. Thus, any NFET leakage current $I_N$ is provided to an NFET leakage frequency counter 614 as leakage current from the NFET 610. The NFET leakage current $I_N$ is coupled to a series of gates (G) of NFETs 616(1)-616(Q) in an NFET ring oscillator circuit 618 in the NMOS sensor 210. The NFETs 616(1)-616(Q) are each configured to control activation of a respective buffer circuit 620(1)-620(Q) configured in an oscillation loop 622. Thus, the strength of the NFET leakage current $I_N$ controls the turn-on strength of the NFETs 616(1)-616(Q) in the NFET ring oscillator circuit 618, which in turn controls the speed or oscillation of the buffer circuits 620(1)-620(Q) to provide an indication of the NFET leakage current. For example, each iteration of the oscillation loop 622 could be used to increment an NFET leakage frequency count.

Figure 7:
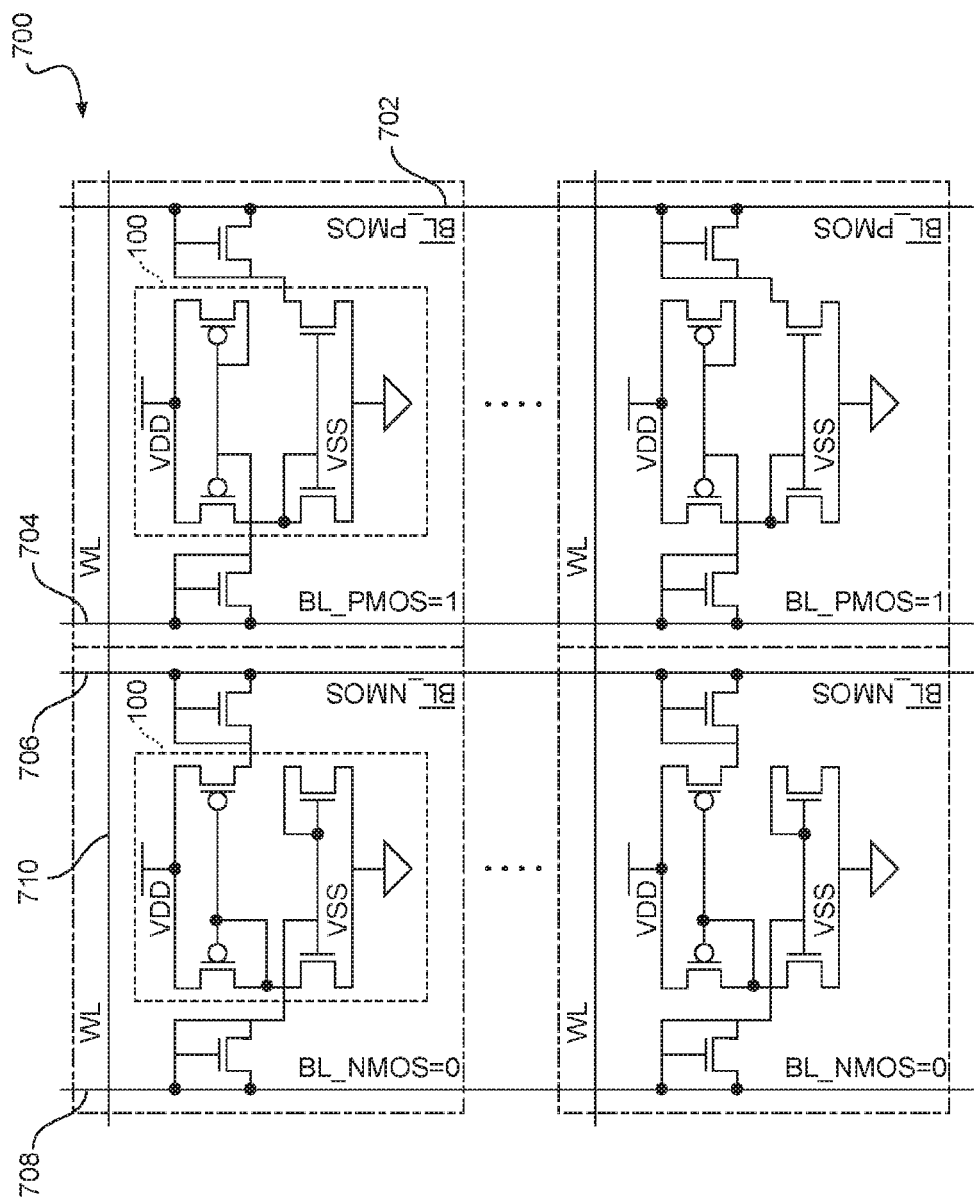
FIG. 7 is a circuit diagram of an alternate bit cell that allows for sensor placement that may be used to detect information about speed characteristics for memory elements.

FIG. 7 provides a circuit diagram of a bit cell 700 which allows for sensor positioning on the $\overline{BL}$ lines. In this regard, the bit cell 700 has a $\overline{BL}$_PMOS line 702 and a BL_PMOS line 704. Additionally, the bit cell 700 has a $\overline{BL}$_NMOS line 706 and a BL_NMOS line 708. The bit cell 700 further has a write line (WL) 710. Array designers for SRAM arrays (or other arrays) may share a WL across bit cells in a row. This placement of the WL 710 allows continuity of the WL across the row in scenarios where the modified bit cell based columns happen to be placed in the middle of an array of foundry optimized bit cells instead of along the periphery. This allows easier sensor placement. Sensors such as the first LCRO 506 of FIG. 5 may be coupled to the $\overline{BL}$_NMOS line 706 and the second LCRO 512 to the $\overline{BL}$_PMOS line 702. The current on the respective $\overline{BL}$ line is an average leakage current from the total number of cells in a given column. This leakage current may then control the respective current starved ring oscillators 504 and 510. Building an array with such modified cells may help scale the magnitude of the leakage current for better measurability and provide a better estimate of average leakage current.

While two types of leakage sensors are illustrated, it should be appreciated that there may be other sensors that provide information relating to a speed characteristic of the sub-elements within the memory element 100 without departing from the scope of the present disclosure.

The adaptive power regulation methods and systems according to aspects disclosed herein may be provided in or integrated into any processor-based device. Examples, without limitation, include a set top box, an entertainment unit, a navigation device, a communications device, a fixed location data unit, a mobile location data unit, a mobile phone, a cellular phone, a smart phone, a tablet, a phablet, a server, a computer, a portable computer, a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, a portable digital video player, and an automobile.

Figure 8:
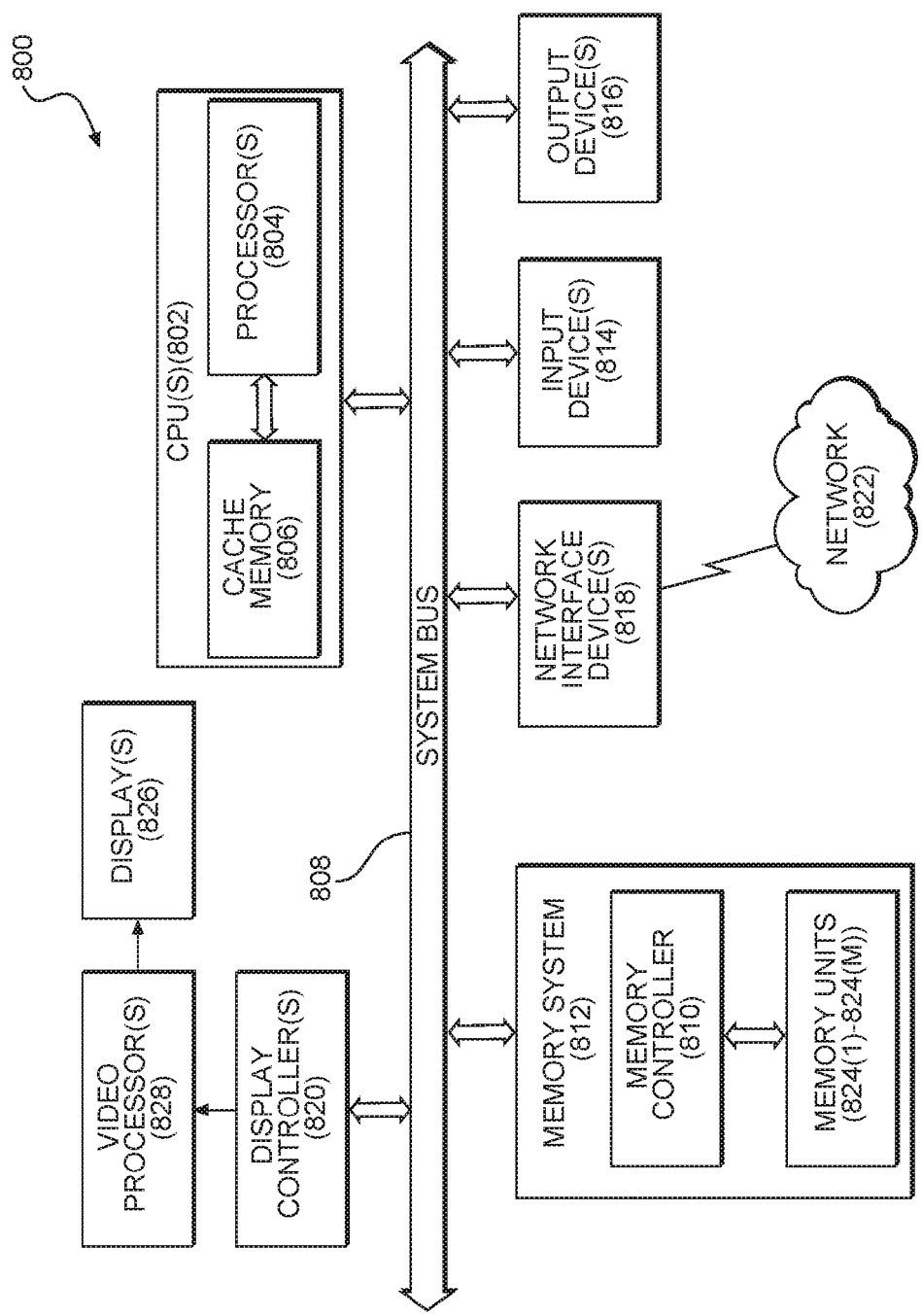
FIG. 8 is a block diagram of an exemplary processor-based system that can include the systems of FIGS. 2 and 3.

In this regard, FIG. 8 illustrates an example of a processor-based system 800 that can employ the memory element 100 and systems 200 and 300 illustrated in FIGS. 2 and 3. In this example, the processor-based system 800 includes one or more central processing units (CPUs) 802, each including one or more processors 804. The CPU(s) 802 may have cache memory 806 coupled to the processor(s) 804 for rapid access to temporarily stored data. The CPU(s) 802 is coupled to a system bus 808 and can intercouple master and slave devices included in the processor-based system 800. As is well known, the CPU(s) 802 communicates with these other devices by exchanging address, control, and data information over the system bus 808. For example, the CPU(s) 802 can communicate bus transaction requests to a memory controller 810 as an example of a slave device. Although not illustrated in FIG. 8, multiple system buses 808 could be provided, wherein each system bus 808 constitutes a different fabric.

Other master and slave devices can be connected to the system bus 808. As illustrated in FIG. 8, these devices can include a memory system 812, which may include the memory element 100, one or more input devices 814, one or more output devices 816, one or more network interface devices 818, and one or more display controllers 820, as examples. The input device(s) 814 can include any type of input device, including, but not limited to, input keys, switches, voice processors, etc. The output device(s) 816 can include any type of output device, including, but not limited to, audio, video, other visual indicators, etc. The network interface device(s) 818 can be any devices configured to allow exchange of data to and from a network 822. The network 822 can be any type of network, including, but not limited to, a wired or wireless network, a private or public network, a local area network (LAN), a wireless local area network (WLAN), a wide area network (WAN), a BLUETOOTH™ network, and the Internet. The network interface device(s) 818 can be configured to support any type of communications protocol desired. The memory system 812 can include one or more memory units 824(0-N).

The CPU(s) 802 may also be configured to access the display controller(s) 820 over the system bus 808 to control information sent to one or more displays 826. The display controller(s) 820 sends information to the display(s) 826 to be displayed via one or more video processors 828, which process the information to be displayed into a format suitable for the display(s) 826. The display(s) 826 can include any type of display, including, but not limited to, a cathode ray tube (CRT), a liquid crystal display (LCD), a plasma display, a light emitting diode (LED) display, etc.

Those of skill in the art will further appreciate that the various illustrative logical blocks, modules, circuits, and algorithms described in connection with the aspects disclosed herein may be implemented as electronic hardware, instructions stored in memory or in another computer readable medium and executed by a processor or other processing device, or combinations of both. The devices described herein may be employed in any circuit, hardware component, integrated circuit (IC), or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices (e.g., a combination of a DSP and a microprocessor, a plurality of microprocessors, one or more microprocessors in conjunction with a DSP core, or any other such configuration).

The aspects disclosed herein may be embodied in hardware and in instructions that are stored in hardware, and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flowchart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein, but is to be accorded the widest scope consistent with the principles and novel features disclosed herein.

What is claimed is:

1. A control circuit for controlling a data retention voltage (DRV) for a memory element, the control circuit comprising:
    a sensor circuit comprising a current starved ring oscillator and a frequency counter configured to determine frequency information based on a sensed leakage current;
    a mapping logic circuit configured to:
        receive the frequency information from the sensor circuit with information relating to a speed characteristic of sub-elements of a memory element; and
        map the information to a process variation identifier;
    a DRV mapping logic circuit configured to map the process variation identifier to a desired DRV and output information relating to the desired DRV; and
    a power control circuit configured to receive the information relating to the desired DRV and generate a power control signal for a power management unit (PMU) circuit.

2. The control circuit of claim 1, wherein the mapping logic circuit comprises a look-up table and the mapping logic circuit is configured to map the information to a process variation corner identifier using the look-up table.

3. The control circuit of claim 1, wherein the mapping logic circuit is configured to receive the information relating to the speed characteristic from the sensor circuit.

4. The control circuit of claim 3, wherein the information relating to the speed characteristic comprises a frequency count based on the sensed leakage current of the sub-elements within the memory element.

5. The control circuit of claim 1, wherein the power control circuit comprises a finite state machine.

6. The control circuit of claim 1, wherein the DRV mapping logic circuit comprises a look-up table and the DRV mapping logic circuit maps the process variation identifier to the desired DRV using the look-up table.

7. The control circuit of claim 1, wherein the DRV mapping logic circuit is further configured to receive temperature information from a temperature sensor.

8. The control circuit of claim 1, wherein the DRV mapping logic circuit is further configured to receive aging information.

9. The control circuit of claim 1 integrated into an integrated circuit (IC).

10. The control circuit of claim 1 integrated into a device selected from the group consisting of: a set top box; an entertainment unit; a navigation device; a communications device; a fixed location data unit; a mobile location data unit; a mobile phone; a cellular phone; a smart phone; a tablet; a phablet; a server; a computer; a portable computer; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; a portable digital video player; and an automobile.

11. A system for controlling power for a memory element, comprising:
    a sensor circuit comprising a current starved ring oscillator and a frequency counter, the sensor circuit configured to determine frequency information related to a process speed characteristic of an associated memory element based on a sensed leakage current;
    a control circuit configured to receive an indication of the process speed characteristic from the sensor circuit and output a power control signal based at least in part on the process speed characteristic; and
    a power management unit (PMU) circuit configured to receive the power control signal from the control circuit and control voltage rails for the associated memory element.

12. The system of claim 11, wherein the frequency information related to the process speed characteristic comprises a frequency value based on the sensed leakage current.

13. The system of claim 11, further comprising a temperature sensor coupled to the control circuit and wherein the power control signal is based at least in part on a temperature value received from the temperature sensor.

14. The system of claim 11, wherein the control circuit comprises:
a mapping logic circuit configured to:
receive the frequency information related to the process speed characteristic; and
map the frequency information to a process variation identifier;
a data retention voltage (DRV) mapping logic circuit configured to map the process variation identifier to a desired DRV and output information relating to the desired DRV; and
a power control circuit configured to receive the information relating to the desired DRV and generate the power control signal for the PMU circuit.

15. The system of claim 14, wherein the power control circuit comprises a finite state machine.

16. The system of claim 14, wherein the mapping logic circuit comprises a look-up table and the mapping logic circuit is configured to map the frequency information to a process variation corner identifier using the look-up table.

17. The system of claim 14, wherein the DRV mapping logic circuit comprises a look-up table and the DRV mapping logic circuit maps the process variation identifier to the desired DRV using the look-up table.

18. A method for controlling power provided to a memory element, comprising:
sensing leakage current from sub-elements within a memory element;
determining frequency information based on the sensed leakage current using a current starved ring oscillator and a frequency counter;
receiving the frequency information relating to a speed characteristic of the sub-elements within the memory element;
mapping the frequency information relating to the speed characteristic to a process variation corner;
determining a desired data retention voltage (DRV); and
generating a power control signal based on the desired DRV.

19. The method of claim 18, wherein receiving the frequency information comprises receiving information related to a frequency.

20. The method of claim 18, wherein mapping the frequency information relating to the speed characteristic to the process variation corner comprises using a look-up table.

21. The method of claim 18, wherein determining the desired DRV comprises using a look-up table.

22. The method of claim 18, further comprising receiving temperature data and wherein determining the desired DRV comprises using the temperature data.

23. The method of claim 18, further comprising receiving aging data and wherein determining the desired DRV comprises using the aging data.

24. The method of claim 18, wherein generating the power control signal based on the desired DRV comprises using a finite state machine to generate the power control signal.

25. The method of claim 24, further comprising sending the power control signal to a power management unit (PMU) circuit.

26. The method of claim 25, further comprising controlling voltages on voltage rails for the memory element according to the desired DRV with the PMU circuit.

27. An adaptive data retention voltage (DRV) circuit, comprising:
a sensor circuit comprising a current starved ring oscillator and a frequency counter, the sensor circuit configured to:
determine a first leakage current corresponding to P-type metal oxide semiconductor (MOS) (PMOS) transistors indicative of a process variation;
determine a second leakage current corresponding to N-type MOS (NMOS) transistors indicative of the process variation;
generate a first frequency based on the first leakage current; and
generate a second frequency based on the second leakage current; and
a controller circuit configured to:
generate a first speed characteristic based on the first frequency;
generate a second speed characteristic based on the second frequency;
generate a process corner identifier based on the first speed characteristic and the second speed characteristic;
generate an adaptive DRV based on the process corner identifier; and
generate DRV control signals based on the adaptive DRV.

* * * * *